United States Patent
Gosset et al.

(10) Patent No.: US 7,936,563 B2
(45) Date of Patent: May 3, 2011

(54) ON-CHIP INTERCONNECT-STACK COOLING USING SACRIFICIAL INTERCONNECT SEGMENTS

(75) Inventors: Laurent Gosset, Eindhoven (NL); Vincent Arnal, Grenoble (FR)

(73) Assignee: NXP B.V., Eindhoven (NL)

( * ) Notice: Subject to any disclaimer, the term of this patent is extended or adjusted under 35 U.S.C. 154(b) by 133 days.

(21) Appl. No.: 12/158,989

(22) PCT Filed: Dec. 19, 2006

(86) PCT No.: PCT/EP2006/069910
§ 371 (c)(1), (2), (4) Date: Jun. 23, 2008

(87) PCT Pub. No.: WO2007/071674
PCT Pub. Date: Jun. 28, 2007

(65) Prior Publication Data
US 2008/0266787 A1    Oct. 30, 2008

(30) Foreign Application Priority Data
Dec. 23, 2005   (EP) ..................................... 05301103

(51) Int. Cl.
*H05K 7/20* (2006.01)
*H01L 23/367* (2006.01)
*H01L 21/764* (2006.01)

(52) U.S. Cl. ................... 361/689; 361/679.53; 361/699; 361/718; 257/713; 257/714; 438/122

(58) Field of Classification Search ............. 361/679.53, 361/689, 699, 704, 718–720; 165/80.3, 104.33; 257/714, E23.098, 713; 438/122, 619
See application file for complete search history.

(56) References Cited

U.S. PATENT DOCUMENTS

| 4,814,030 A | * | 3/1989 | Dubuisson et al. | ........ 156/89.17 |
| 4,859,520 A | * | 8/1989 | Dubuisson et al. | ........... 428/137 |
| 5,000,818 A |   | 3/1991 | Thomas et al. | |
| 5,690,763 A | * | 11/1997 | Ashmead et al. | ............... 156/60 |
| 5,763,951 A | * | 6/1998 | Hamilton et al. | ............. 257/714 |
| 5,798,559 A | * | 8/1998 | Bothra et al. | .................. 257/522 |
| 5,901,037 A | * | 5/1999 | Hamilton et al. | ............. 361/699 |
| 6,043,005 A | * | 3/2000 | Haq | .............................. 430/331 |
| 6,083,837 A |   | 7/2000 | Millet | |

(Continued)

FOREIGN PATENT DOCUMENTS
JP          2005294760 A     10/2005

OTHER PUBLICATIONS

English translation of JP 2005-294760 (published Oct. 20, 2005), machine translated on Mar. 7, 2011.*

(Continued)

*Primary Examiner* — Robert J Hoffberg

(57) ABSTRACT

The present invention relates to an integrated-circuit device and to a method for fabricating an integrated-circuit device with an integrated fluidic-cooling channel. The method comprises forming recesses in a dielectric layer sequence at desired lateral positions of electrical interconnect segments and at desired lateral positions of fluidic-cooling channel segments. A metal filling is deposited in the recesses of the dielectric layer sequence so as to form the electrical interconnect segments and to form a sacrificial filling in the fluidic-cooling channel segments. Afterwards, the sacrificial metal filling is selectively removed from the fluidic-cooling channel segments.

19 Claims, 8 Drawing Sheets

U.S. PATENT DOCUMENTS

| | | | |
|---|---|---|---|
| 6,242,075 B1* | 6/2001 | Chao et al. | 428/138 |
| 6,377,457 B1* | 4/2002 | Seshan et al. | 361/690 |
| 6,521,516 B2* | 2/2003 | Monzon et al. | 438/514 |
| 6,665,185 B1* | 12/2003 | Kulik et al. | 361/699 |
| 6,713,835 B1* | 3/2004 | Horak et al. | 257/522 |
| 6,772,513 B1* | 8/2004 | Frye-Mason et al. | 29/840 |
| 6,785,134 B2* | 8/2004 | Maveety et al. | 361/699 |
| 6,821,819 B1* | 11/2004 | Benavides et al. | 438/122 |
| 6,919,231 B1* | 7/2005 | Ramanathan et al. | 438/122 |
| 6,919,636 B1* | 7/2005 | Ryan | 257/751 |
| 6,972,955 B2* | 12/2005 | Pleskach et al. | 361/689 |
| 7,091,604 B2* | 8/2006 | Wylie et al. | 257/713 |
| 7,179,747 B2* | 2/2007 | Papa Rao et al. | 438/700 |
| 7,215,547 B2* | 5/2007 | Chang et al. | 361/701 |
| 7,309,620 B2* | 12/2007 | Fonash et al. | 438/53 |
| 7,358,201 B2* | 4/2008 | Ramanathan et al. | 438/800 |
| 7,427,526 B2* | 9/2008 | Fonash et al. | 438/33 |
| 7,434,308 B2* | 10/2008 | Lu et al. | 29/830 |
| 7,485,963 B2* | 2/2009 | Papa Rao et al. | 257/758 |
| 7,569,426 B2* | 8/2009 | Myers et al. | 438/122 |
| 2003/0173674 A1* | 9/2003 | Nakamura | 257/758 |
| 2005/0068726 A1 | 3/2005 | Pleskach et al. | |
| 2005/0139996 A1* | 6/2005 | Myers et al. | 257/712 |
| 2005/0145506 A1 | 7/2005 | Taylor et al. | |
| 2005/0167841 A1* | 8/2005 | Papa Rao et al. | 257/758 |
| 2005/0170670 A1* | 8/2005 | King et al. | 438/800 |
| 2005/0269665 A1 | 12/2005 | Wylie et al. | |
| 2006/0034052 A1* | 2/2006 | Chang et al. | 361/697 |
| 2006/0134831 A1* | 6/2006 | Cohen et al. | 438/108 |
| 2007/0126103 A1* | 6/2007 | Shi | 257/686 |
| 2009/0057881 A1* | 3/2009 | Arana et al. | 257/714 |
| 2009/0197371 A1* | 8/2009 | Cohen et al. | 438/108 |
| 2009/0321946 A1* | 12/2009 | Gosset | 257/774 |

OTHER PUBLICATIONS

Dang et al., "Wafer-Level Microfluidic Cooling Interconnects for GSI," Interconnect Technology Conference 2005, Proceedings of the IEEE 2005 International Burlingame, CA, USA Jun. 6-8, 2005, Piscataway, NJ, USA, IEEE, US, Jun. 6, 2005, pp. 180-182.

Bakir et al., "Integrated Electrical, Optical, and Thermal High Density and Compliant Wafer-Level Chip I/O Interconnections for Gigascale Integration," 2004 Electronic Components and Technology Conference, pp. 1-6.

Streiter et al., "Application of combined thermal and electrical simulation for optimization of deep submicron interconnection systems," Microelectronic Engineering 60 (2002), pp. 39-49.

\* cited by examiner

ON-CHIP INTERCONNECT-STACK COOLING USING SACRIFICIAL INTERCONNECT SEGMENTS

The present invention relates to an integrated-circuit device with an integrated fluidic-cooling channel. The invention further relates to a method for fabricating an integrated-circuit device with an integrated fluidic-cooling channel.

Integrated-circuit devices like microprocessors are subject to an undesired, yet unavoidable transformation of electrical energy into thermal energy, that is, they generate heat during operation. The International Technology Roadmap for Semiconductors (ITRS) expects generated heat power densities due to such energy dissipation as high as 100 W/cm² for future high-performance integrated-circuit devices that employ the technology node predicted for the year 2018.

The document B. Dang et al., Wafer-Level Microfluidic Cooling Interconnect for GSI, Proceedings of International Interconnect Technology Conference 2005, San Francisco, Jun. 6-8, 2005, pp. 180-182, proposes a heat removal concept for integrated-circuit devices using microfluidic backside cooling. After the fabrication of a wafer, and after fabrication of the interconnect stack for the chips on the wafer, but prior to dicing the wafer into individual chips, deep trenches are etched into the wafer on its backside and filled with a sacrificial polymer, which is then covered with a porous overcoat layer. The sacrificial polymer decomposes when the wafer is heated, leaving liquid-cooling channels in the form of microchannels enclosed by the wafer material and the porous overcoat layer. A second overcoat layer is then applied to provide mechanical strength and sealing. Fluidic input and output ports are formed by through-chip holes and polymer pipes on the wafer backside. The chips are mounted onto a liquid-cooled printed wiring board (PWB), in a flip-chip configuration. The PWB is equipped with embedded microfluidic channels as well and powered by integrated or external pumps for liquid circulation.

Future integrated-circuit technology nodes will exhibit an increasing number of metallic interconnect levels in the interconnect stack of an integrated-circuit device, thus also increasing the heat production in the interconnect stack. In addition, the required use of low-k dielectric materials for intralevel dielectric layers, or even air insulation between interconnect segments on the same interconnect level, will reduce the heat dissipation. Since low and ultra low-k dielectric materials have a much lower thermal conductivity than $SiO_2$, heat dissipation from an interconnect stack comprising these materials mainly occurs due to the metal interconnect segments and not due to the dielectrics. As a result, increased heat generation in the interconnect stack and reduced heat dissipation from the interconnect stack to the substrate will cause critical thermal conditions in the interconnect stack of an integrated-circuit device, leading to an increased junction leakage, reduced operating reliability, and, in the worst case, operating failures.

In order to enhance heat dissipation from the interconnect stack into the substrate, an addition of thermal vias connecting the interconnect stack to the substrate has been proposed by R. Streiter et al., "Optimization of interconnections systems including aerogels by thermal and electrical simulation", Proceedings of Advanced Metallization Conference 1999. Tungsten (W) contacts between Cu interconnects and the Si wafer provide for some thermal dissipation from the interconnects through the substrate.

Still, in view of the enormous heat power densities of integrated-circuit devices in future technology nodes, there is a need to improve the dissipation of heat generated in the interconnect stack.

It is therefore preferred to provide an integrated-circuit device that has an improved heat dissipation.

It is further preferred to provide a method for fabrication of an integrated-circuit device, which has an improved heat dissipation.

According to a first aspect of the invention, an integrated-circuit device with an integrated fluidic-cooling channel is provided, comprising a semiconductor substrate with an integrated circuit an interconnect stack on the substrate, having electrical interconnect segments on one or more interconnect levels and comprising a dielectric layer sequence with a respective intralevel dielectric layer on a respective associated interconnect level, electrically isolating different interconnect segments on the associated interconnect level from each other, and with In the integrated circuit-device of the invention, the interconnect stack comprises a fluidic-cooling channel that extends within at least one of the interconnect levels of the interconnect stack and that is conducted within the respective associated intralevel dielectric layers and, in case of an extension over more than one interconnect level, through respective interlevel metallization barrier layers.

The integrated circuit-device of the invention forms a novel concept for improved heat dissipation from the interconnect stack. While fluidic cooling is known per se and prior-art devices have employed it, it has only been applied in the bulk of the substrate, at a safe distance from any electronic circuit and electrical interconnects. Fluidic cooling has not been considered in the art as a technique for heat dissipation in the interconnect stack, or for heat dissipation from the interconnect stack into the substrate, or from the interconnect stack to an external heat sink. However, according to the invention, the fluidic-cooling channel is embedded in electrically isolating material, which is formed by the intralevel dielectric layer. A contact of a liquid with the metallic interconnect segments can be avoided by a proper mask layout that accommodates both, the metallic interconnect segments and the cooling-channel segments. Technological difficulties that are involved in the production of a fluidic-cooling channel in the interconnect stack are overcome by the method of the invention, which will be described later as a second aspect of the invention.

It is noted that an interconnect level is understood as a section of the interconnect stack that extends between two interlevel metallization barrier layers. Interconnect levels can be numbered according to their distance from the substrate. The first interconnect level extends between a first interlevel metallization barrier layer, which is closest to the substrate, and a second interlevel metallization barrier layer, which is the next closest one. A second interconnect level extends between the second and a third interlevel metallization barrier layer, and so on. Associated levels of metal interconnects are named "metal 1", "metal 2", "metal 3", and so on, depending on the interconnect level, to which they belong. Different metal interconnect levels may be connected through via segments. An intralevel dielectric layer is a dielectric layer that extends on a respective interconnect level, that is, between two interlevel metallisation barrier layers.

Further note that the term "fluidic cooling" is used throughout the present specification, and meant to include miniaturized fluidic cooling systems, which are referred to in the art as microfluidic cooling systems. In fact, as will become clear during the course of the further description of the invention, miniaturized fluidic-cooling channels, which are called microfluidic channels in the art, are encompassed by the term "fluidic-cooling channel" and indeed form a preferred embodiment. However, the term "microfluidic" might be understood to imply a limitation in size or geometry to the micrometer range, which limitation shall not be applicable with respect to the present invention. In particular, the fluidic-cooling channel of the integrated-circuit device of the invention can have lateral extensions, which are in the nanometer range, as long as fluidic transport is ensured by the size and geometry of the channel. On the other hand, the invention does not exclude lateral extensions in the millimeter range either. Larger channel diameters could be useful in some sections of the channel, for instance in a fluidic-cooling-channel network that has smaller branches and larger trunk sections close to a fluid input or output interface, as will be described later in more detail with respect to a preferred embodiment. While preferably applied within the framework of present-day and future technology nodes, the invention can of course also be applied for devices with larger circuit elements, according to a 0.25 µm CMOS technology, for instance.

The term "channel" will be used herein with the same meaning as "fluidic-cooling channel".

In the following, preferred embodiments of the integrated-circuit device of the invention will be described. Different embodiments can be combined to form further embodiments, unless they are explicitly introduced as alternatives to each other.

Generally, the fluidic-cooling channel extends between a fluidic-cooling input interface and a fluidic-cooling output interface. In one embodiment, the sidewalls of the fluidic-cooling channel are covered with a dielectric liner, which is adapted to form a barrier for avoiding a contact between a fluidic cooling medium and a surrounding material of the intralevel dielectric or interlevel metallization barrier layer. Such a liner helps in strengthening the fluidic-cooling channel during the fluid circulation inside the interconnect stack. Dielectric liners can also function as diffusion barrier layers to help avoiding an outdiffusion of interconnect metal such as copper during the fabrication of the interconnect stack, before Cu is removed to form the channels.

A further embodiment comprises a sealing layer which seals the highest interconnect level of the interconnect stack so as to prevent a discharge of a cooling fluid from the fluidic-cooling channel. Undesired openings in the fluidic-cooling channel are thus sealed. Note that desired interface openings can easily be restored by a local removal of the sealing layer. The sealing layer is preferably a dielectric layer.

The integrated-circuit device of the invention can be advantageously used in combination with fluidic-cooling concepts of the prior art that provide a local cooling of the substrate. In a preferred embodiment therefore, the fluidic-cooling channel extends into the substrate. This embodiment enables a temperature regulation of the chip as a whole, in other words, a full-chip temperature control, including the substrate and the interconnect stack. It enables an enhanced, one-directional or bi-directional heat dissipation between the substrate and the interconnect stack, depending on the desired arrangement of the channel and on the desired flow direction of the cooling fluid.

In this context it becomes clear that different ways of connecting the fluidic-cooling channel to an external fluid pump are possible. The fluidic-cooling channel generally extends between a fluidic-cooling input interface and a fluidic-cooling output interface. The interfaces can either be arranged on an outer face of the substrate, if the fluidic-cooling channel extends into the substrate to provide additional cooling there. Alternatively, one or both interfaces can be arranged on an outer face of the interconnect stack. The arrangement of the fluid interfaces will depend on the desired packaging concept. For instance, an integrated-circuit device that is fabricated to fit into a flip-chip arrangement should have fluid interfaces provided on the wafer (substrate) backside, that is, the substrate side that faces away from the interconnect stack. For this side will also face away from a PWB, onto which the integrated-circuit device is mounted in a flip-chip-arrangement, leaving enough room for fluid interconnects.

In a further preferred embodiment, the fluidic-cooling channel comprises intralevel cooling-channel segments, which extend on a respective interconnect level, and which are confined by an interlevel metallization barrier layer on either a top side, which faces away from the substrate, or on a bottom side, which faces towards the substrate, and which are further confined by the intralevel dielectric layer on the respective opposite side. In the first alternative, the channel segment can also be called a trench channel-segment, while in the second alternative, the channel segment is also called a via channel-segment, in correspondence to the nomenclature used for electrical interconnect segments. This embodiment reflects structural properties, which result from a fabrication process that uses the method of the second aspect of the invention.

A second aspect of the present invention is formed by a method for fabricating an integrated-circuit device with an integrated fluidic-cooling channel. The method of the invention comprising:

providing a substrate with an integrated circuit;
depositing a dielectric layer sequence on the substrate comprising at least one intralevel dielectric layer;
forming a mesh of lines as to form electrical interconnect segments and a sacrificial filling in the fluidic-cooling channel segments;
selectively removing the sacrificial filling from the fluidic-cooling channel segments.

The method of the invention provides a technique for integrating a fluidic-cooling channel into the interconnect stack. A mesh is formed for both electrical interconnect segments and fluidic-cooling channel segments. The sacrificial metal filling is removed selectively from the fluidic-cooling channel segments.

The method is thus based on the principle that the cooling-channel paths are directly and simultaneously designed and fabricated with electrical interconnect segments, which are dedicated to electrical signal propagation. No extra mask steps are required for the formation of the sacrificial filling that are to form fluidic-cooling channel segments, in case the interconnects and the sacrificial are made of the same material. In that case, the material is preferably copper, aluminum or a mix of metal with either one as a main part.

The formation of the fluidic-cooling channel segments is thus integrated into the fabrication of the interconnect stack. Only a few additional steps are inserted for the removal of the sacrificial metal filling from the recesses, which are to form fluidic-cooling channel segments.

The method of the invention is compatible with the highly developed processing techniques for forming interconnect stacks in ultra large scale integration (ULSI) processes.

The method of the invention allows a formation of fluidic-cooling channel segments on one or more interconnect levels. If a fluidic-cooling channel is to extend over more interconnect levels, the processing sequence of the method of the invention up to the deposition of the sacrificial metal filling can be repeated in connection with the formation of the respective higher interconnect levels. The selective removal of the sacrificial filling can then be performed in alternative embodiments, which will be described further below, either separately on each interconnect level or once for all deposited interconnect levels. Fluidic communication between channel segments on different interconnect levels can be provided naturally by fabricating fluidic via channel-segments using the same technology as for forming via segments of the electrical interconnect system, but again with a sacrificial filling in the fluidic via channel-segments.

However, as mentioned before, a repeated processing of the method of the invention is optional and depends on the desired design of the interconnect stack, in particular on the number of interconnect levels, and of the fluidic-cooling channel.

In the following, preferred embodiments of the method of the invention will be described. Different embodiments can be combined to form further embodiments, unless they are explicitly introduced as alternatives to each other.

In an embodiment of the invention, forming a mesh of lines comprises: forming recesses in the dielectric layer sequence at desired lateral positions of electrical interconnect segments and at desired lateral positions of fluidic-cooling channel segments; and depositing a metal filling in the recesses of the dielectric layer sequence so as to form the electrical interconnect segments and the sacrificial filling in the fluidic-cooling channel segments.

The advantage of this embodiment is that it is very compatible with a dual damascene interconnect module as used in today's modern ULSI processes; the mesh of lines is formed by etching trenches and filling the trenches. In most cases, this process is followed by a planarisation step to remove excess metal.

Two alternative embodiments provide advantageous ways to selectively remove the sacrificial metal filling from those recesses, which are to form fluidic-cooling channel segments.

According to a first alternative embodiment, the removal comprises the steps of
  depositing a mask layer on an interlevel metallization barrier layer,
  forming an opening in the mask layer and in the interlevel metallization barrier layer at the desired lateral positions of the fluidic-cooling channel,
  removing the mask layer, and
  selectively etching the sacrificial metal filling through the opening in the interlevel metallization barrier layer.

Selective removal of metal from the recesses is thus achieved by selective etching. This technique is particularly easy to integrate into existing processing methods, such as a dual damascene process. The involved chemistry is well known to a person skilled in the art. For instance, nitric acid can be used for selective etching of copper.

The processing cost for removing the sacrificial metal can be further decreased by applying the etch step to more than one interconnect level at a time. However, depending on the selectivity of the etchant used with respect to the material composition of the intralevel dielectric layer, the interlayer metallisation barrier layer, and the chosen metal (Cu is presently preferred), the interlayer metallisation barrier layer may form an undesired etch stop layer. It may therefore be necessary to additionally form an opening in the interlayer metallisation barrier layer underneath the sacrificial metal of one interconnect level in order to be able to etch the sacrificial metal filling on the interconnect level underneath.

For allowing a selective metal removal on at least two interconnect levels without having to form an opening in the interlayer metallisation barrier layer underneath the sacrificial metal, the step of depositing a metal filling in the recesses of the dielectric layer sequence may comprise a step of removing the interlevel metallization barrier layer from the bottom of a recess before the deposition of the metal filling. The interlevel metallization barrier layer may for instance be removed by a punch-through process, which will be explained in more detail with reference to the figures.

An alternative method for removal of the sacrificial metal filling makes use of a reverse metal electrolysis. In this technique, the step of removing the metal filling comprises
  depositing a mask layer on an interlevel metallization barrier layer,
  forming an opening in the mask layer and in the interlevel metallization barrier layer at the at desired lateral positions of the fluidic-cooling channel,
  removing the mask layer,
  performing a reverse electrolysis etching step of the metal filling using a contact formed by the substrate and an electrically conductive connection between the substrate and the metal filling in the recess for the fluidic-cooling channel.

In this metal removal process, the substrate and an electrically conductive connection between the substrate and the metal filling in the recess for the fluidic-cooling channel is advantageously used as a contact. The advantage of the present embodiment is that it can be applied after formation of the complete interconnect stack and need not be interposed after the formation of a respective interconnect level.

A further embodiment comprises a step of depositing a dielectric liner in the recesses that are to form fluidic-cooling channel segments. The material and thickness of the dielectric liner are selected so as to form a barrier for avoiding a contact between a fluidic cooling medium and a surrounding material of the intralevel dielectric layer or interlevel metallization barrier layer, in the recesses before depositing the metal filling. Preferably, the material is also stable in the selective removal step, thus protecting the intralevel dielectric layer from any damage during the selective removal step.

In the following, further preferred embodiments of the integrated circuit device and of the method of the invention will be described in additional detail with respect to the figures.

FIG. 1 shows a coarse schematic view of a first embodiment of an integrated-circuit device according to the invention. The view is schematic in that it shows structural elements of an integrated-circuit device only to the extent that is necessary to explain the invention.

Figure 1:
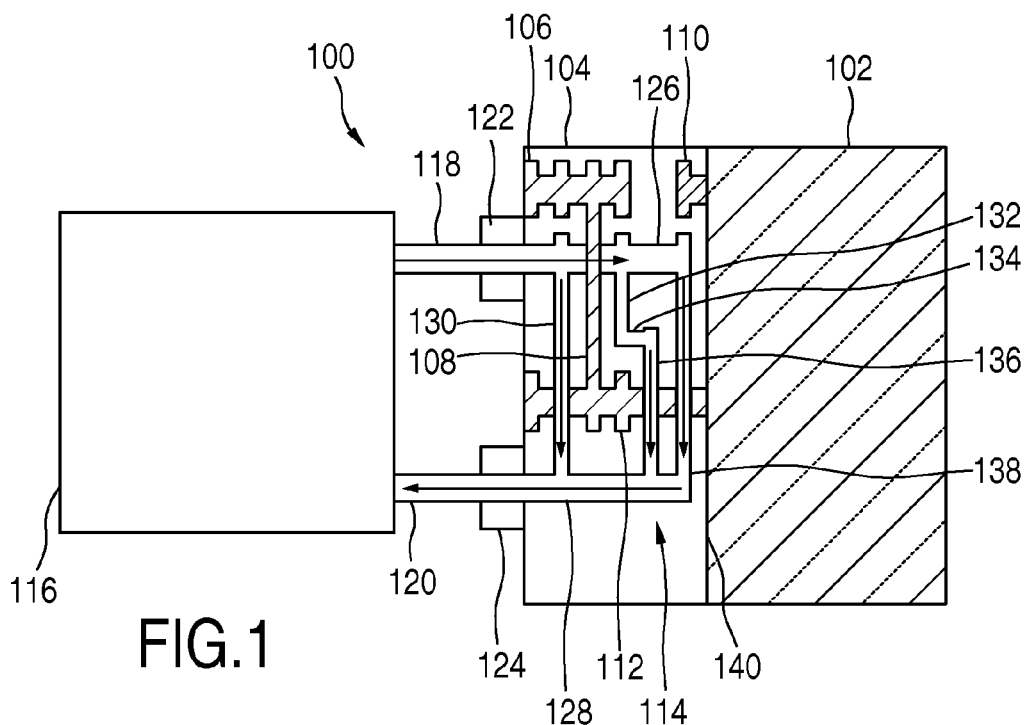
FIG. 1 shows a coarse schematic view of a first embodiment of an integrated-circuit device according to the invention.

The integrated-circuit device 100 of FIG. 1 comprises a semiconductor substrate 102 and an interconnect stack 104 on the substrate 102, which in combination with each other represent a chip that can be obtained from a wafer by dicing. However, the wafer before dicing also forms an integrated circuit device of the invention.

The semiconductor substrate 102 of this embodiment is a silicon substrate and comprises integrated electronic circuit elements (not shown), corresponding to a desired electronic application. Note however, that the invention is not restricted to the use of silicon substrates.

The interconnect stack 104 comprises a number of interconnect levels in a layer sequence, the structure of which is not shown in detail in the schematic diagram of FIG. 1. The detailed structure of interconnect stack 104 will become clear in the course of the further description with reference to later figures. For the time being, it suffices to mention that the interconnect stack contains electrical interconnect segments on each interconnect level, some of which are labeled by way of example with reference numerals 106 to 112. Interconnect segments on different interconnect levels are separated from each other by interlevel metallization barrier layers (not shown in FIG. 1). An intralevel dielectric layer is provided on each respective interconnect level to electrically insulate interconnect segments on the same interconnect level from each other.

The integrated-circuit device 100 of FIG. 1 further comprises a fluidic-cooling channel system 114, which is embedded in the interconnect stack 104. The fluidic-cooling channel system 114 is connected to an external fluidic-cooling circulation driver 116, which is connected to the chip formed by substrate 102 and interconnect stack 104, through fluidic-cooling input and output pipes 118 and 120, respectively. A connection between input and output pipes 118 and 120 and the chip through fluidic-cooling input and output interfaces 122 and 124, respectively, is schematically shown.

The integrated-circuit device 100 can be provided mounted on a printed circuit board with the input and output pipes 118 and 120 connected to the printed wiring board so the printed circuit board can be connected to the external fluidic-cooling circulation driver 116. Advantageously, the external fluidic-cooling circulation driver 116 can be provided connected to a printed circuit board, together with the integrated-circuit device 100, also known as a printed circuit board, as to form a fully functional system that can be directly inserted in for example a computer system or a consumer electronics device.

The fluidic-cooling channel system 114 is made up of interconnected fluid-channels 126 through 138. Vertical trunk channel sections 126 and 128 function as input and output channel sections, which have a comparatively large lateral extension. The term "lateral extension" refers to the distance between sidewalls of the input and output channel sections 126 and 128, respectively, in a direction, which is parallel to an interface 140 between the substrate 102 and the interconnect stack 104, shown as a straight line in FIG. 1, and assumed to be ideally flat for the purpose of the present definition.

The fluidic-cooling channel system 114 also comprises horizontal fluid-channel segments 130, 132, 136, and 138. These channel segments are arranged on respective interconnect levels and extend between the vertical (input and output) trunk channel segments 128 and 130, in order to establish a microfluidic circulation path for a cooling liquid. It is noted that the horizontal fluid-channel sections 130 through 138 resemble respective electrical interconnect segments in their geometrical characteristics. The structure of the electrical interconnect segments and that of the fluidic-cooling channel segments corresponds to that obtained by a known process for forming a interconnect stack, such as a dual damascene process, which is in wide-spread use in the industry. In particular, the vertical height of the horizontal channel sections 130 through 138 corresponds to the vertical height of electrical interconnect segments. Also, the distance between the substrate/interconnect stack interface 140 and a respective horizontal channel segment equals the corresponding distance between interface 140 and respective electrical interconnect segments on a respective interconnect level.

A cooling fluid can thus circulate through cooling channel segments, which are conducted in intralevel dielectric layers on a desired number of interconnect levels. If desired, air could be used instead of an intralevel dielectric layer only in those sections that do not enclose any fluidic-cooling channel segments.

During operation of the integrated-circuit device 100, electrical energy is supplied to integrated circuits on substrate 102 through the electrical interconnects embedded in interconnect stack 104. At the same time, a cooling liquid is provided by microfluidic cooling circulation driver 116, which contains a pump (not shown) for driving the cooling liquid through the input pipe 118 and the input interface 122 into the fluidic-cooling channel system 114 and back out through the output interface 124 and the output pipe 120. Optionally, a fluid reservoir (not shown) is contained in microfluidic cooling circulation driver 116. A fluid reservoir is useful to accommodate any leakage of cooling liquid, or volume changes in the channel system due to temperature changes. Preferably, microfluidic cooling circulation driver 116 provides for heat exchange between the cooling liquid received back from the chip and a heat sink (not shown).

As can be seen from the forgoing explanation, a circulation of a cooling fluid through the fluidic-cooling channel system 114 is driven by the external microfluidic cooling circulation driver 116. The cooling-channel system 114 is embedded into the interconnect stack 104 of integrated-circuit device 100, but electrically isolated from electrical interconnect segments.

The integrated-circuit device 100 therefore enables a heat exchange between the interconnect stack and the cooling liquid circulating in the fluidic-cooling channel system 114. Heat absorbed by the cooling liquid in the interconnect stack is carried to a heat sink, which is external to the chip, by the microfluidic cooling circulation driver 116. If sufficient, heat exchange may be provided by circulation of the liquid through regions of different temperatures in the interconnect stack and through microfluidic cooling circulation driver 116 alone.

Figure 2:
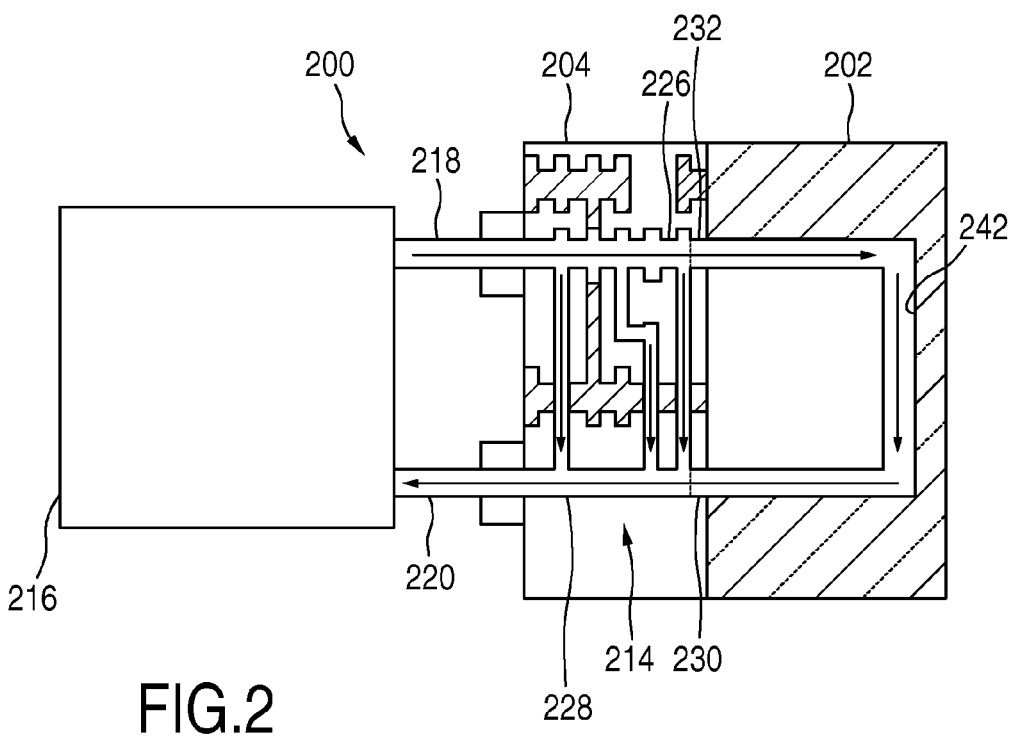
FIG. 2 shows a coarse schematic view of a second embodiment of an integrated-circuit device according to the invention.

FIG. 2 shows a schematic view of a second embodiment of an integrated-circuit device according to the invention.

The integrated-circuit device 200 of FIG. 2 is similar to that of FIG. 1. For that reason, reference numerals will be used for structural elements of the integrated-circuit device 200, which result from those given to identical structural elements of FIG. 1 by a simple replacement of the first digit "1" used in FIG. 1 by "2" in the present FIG. 2.

The integrated-circuit device 200 comprises a chip formed by a substrate 202 and an interconnect stack 204 on substrate 202. A fluidic-cooling channel system 214 is arranged in the interconnect stack 204 and connected to an microfluidic cooling circulation driver 216.

Unlike fluidic-cooling channel system 114 of the integrated-circuit device 100, the fluidic-cooling channel system 214 extends into the substrate 202. A U-shaped substrate channel 242 connects to the input and output trunk channel sections 226 and 228. Via channel sections 230 and 232 establish a connection between the fluidic-cooling channel system 214 and the substrate channel 242.

This embodiment combines the fluidic-cooling channel system in the interconnect stack 204 with a fluidic-cooling channel system in a substrate. It is noted that the U-shape of substrate channel 242 forms one example only. Other channel systems can be used as well. An example of a microfluidic substrate cooling technique that can be combined with the present invention is given in Muhannad S. Bakir and James D. Meindl, Integrated Electrical, Optical, and Thermal High Density and Compliant Wafer-Level Chip I/O Interconnections for Gigascale Integration, IEEE Conference on Electronic Components and Technology, 2004, pp. 1-6.

Figure 3:
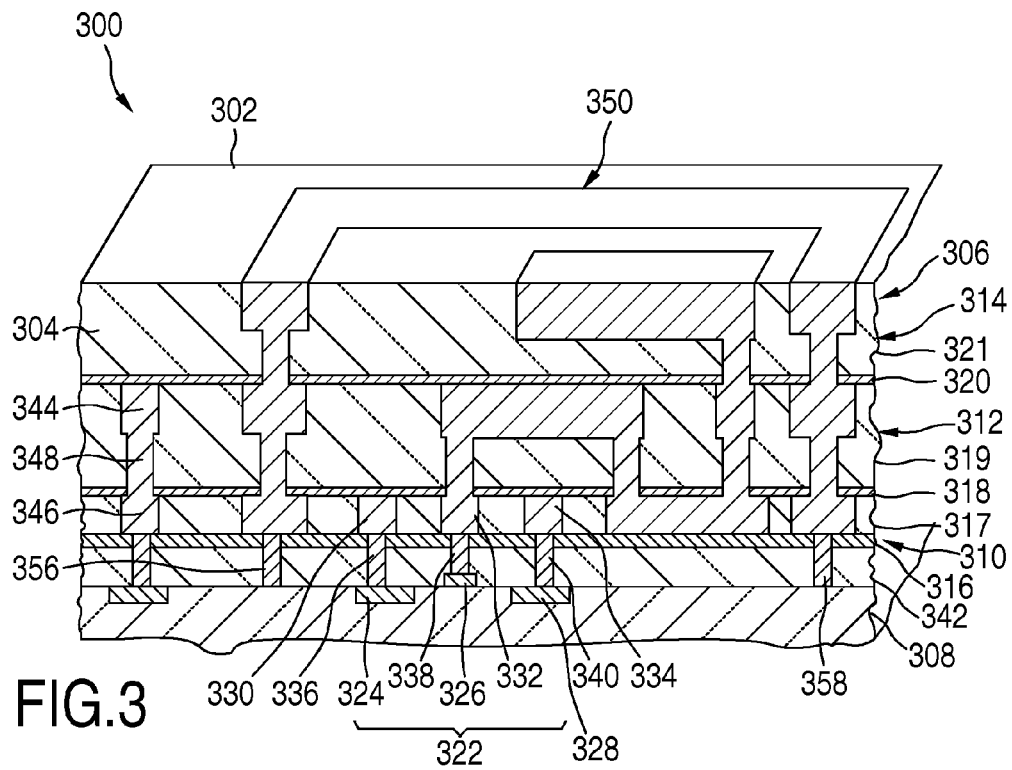
FIG. 3 shows a schematic three-dimensional view of a third embodiment of an integrated-circuit device during fabrication.

FIG. 3 shows a schematic three-dimensional view of a third embodiment of an integrated-circuit device during fabrication. The interconnect structures shown are not meant to reflect a real device structure, but only serve as an exemplary illustration that enables the person skilled in the art to adapt the invention to the design of an interconnect stack for a given application.

FIG. 3 is a schematic three-dimensional view showing a top surface 302 and a sectional face 304 of an interconnect stack 306 on a substrate 308. Only a portion of substrate 308 that is close to interconnect stack 306 is shown in FIG. 3.

The interconnect stack 306 comprises three interconnect levels. A first interconnect level extends between a first and a second interlevel metallization barrier layer 316 and 318, respectively, and comprises an intralevel dielectric layer 317. The second interconnect level 312 extends between a second interlevel metallization barrier layer 318 and a third interlevel metallization barrier layer 320, and comprises an intralevel dielectric layer 319. A third interconnect level extends above the third interlevel metallization barrier layer, and comprises an intralevel dielectric layer 321. There also is a top metallization barrier layer.

The substrate comprises integrated-circuit elements like a transistor structure 322. Transistor structure 322 comprises source, gate and drain contact elements 324, 326, and 328, respectively, which are connected to electrical interconnect segments 330, 332, and 334, respectively on the first interconnect level. An electrical contact between the integrated-circuit elements and the interconnect stack is established by means of metallic plugs, typically tungsten (W) plugs 336, 338, and 340, respectively. A dielectric layer 342, typically a thermal silicon dioxide layer extends between the substrate and the first metallization barrier layer 316 (made, for instance, of silicon nitride), which has openings for the W plugs 336 to 340.

The integrated-circuit device 300 of FIG. 3 is shown in a processing stage, in which electrical interconnect segments and fluidic-cooling channel segments are both filled with metal. This is a transient processing stage. Examples of electrical interconnect segments are those connected with gate contact 326 of transistor 322. It can be seen that the electrical interconnect segments generally comprise trench sections and via sections. Trench sections are arranged immediately underneath a respective interlevel metallization barrier layer. An example is given under reference numeral 344. A connection between this electrical interconnect segment 344 on the second interconnect level and electrical interconnect segment 346 on the first interconnect level is provided by a via segment 348. It is noted that, depending on the technology used for fabricating the interconnect stack, trench segments and via segments may or may not have different lateral extensions. The smaller the technology node, the smaller is typically the difference between the lateral extensions of the trench sections and the via sections.

Figure 4:
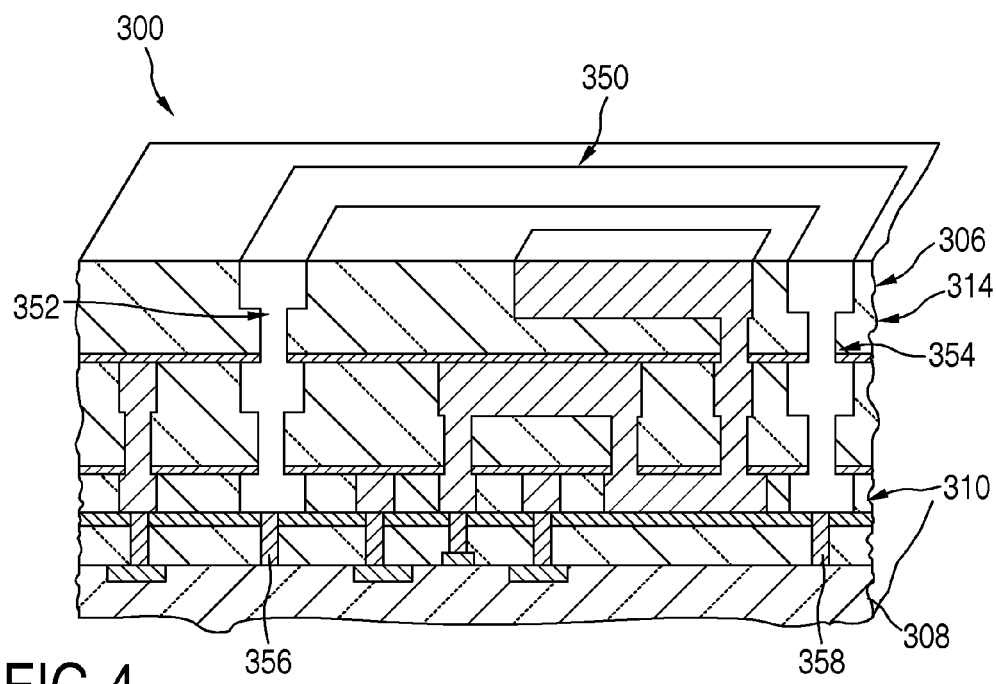
FIG. 4 shows a schematic three-dimensional view of the integrated-circuit device of FIG. 3 at a later processing stage.
Figure 5:
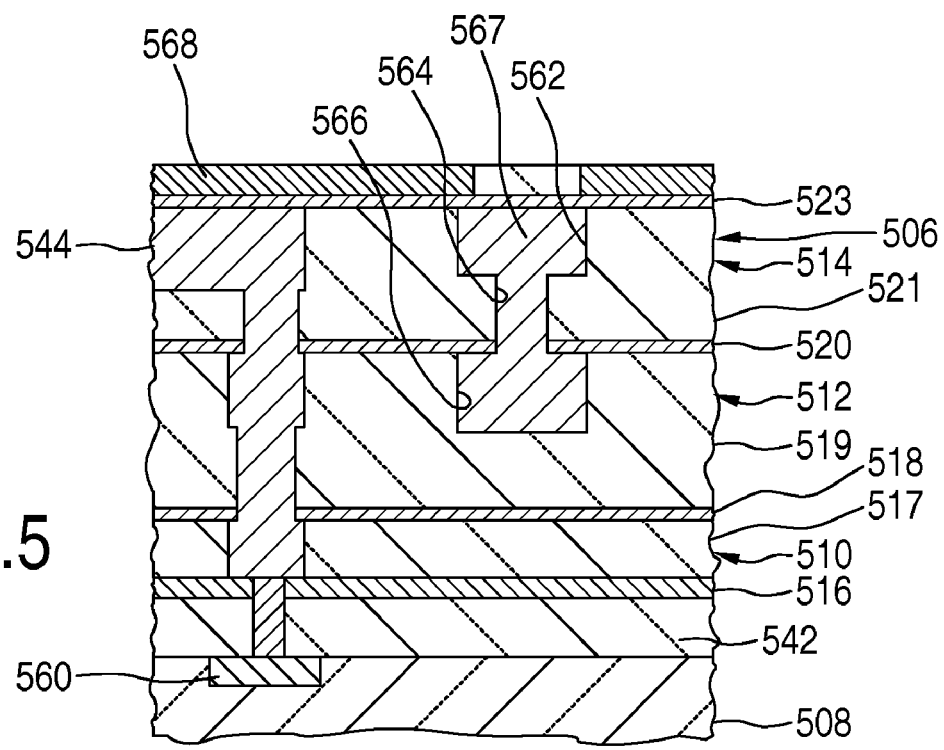
FIGS. 5 to 8 show different stages of an integrated-circuit device of the invention during fabrication, using a first embodiment of the method of the invention.
Figure 6:
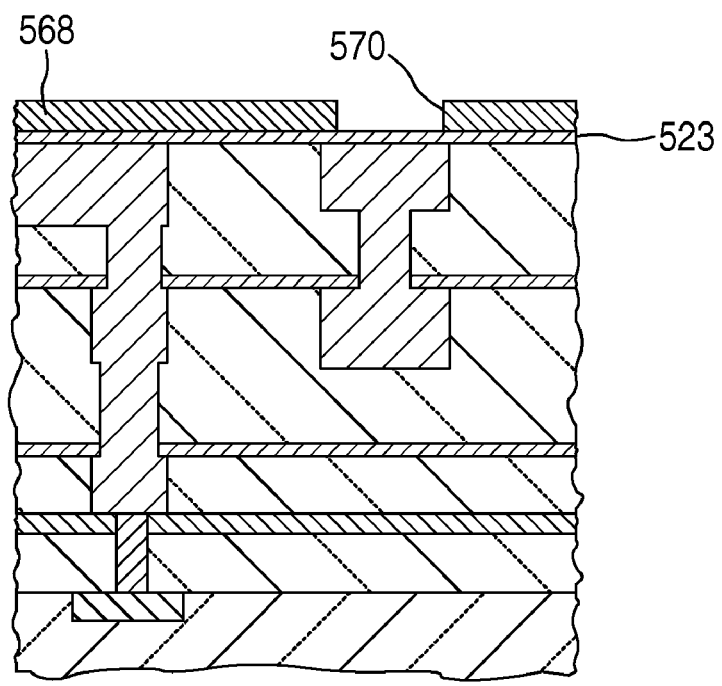
Figure 7:
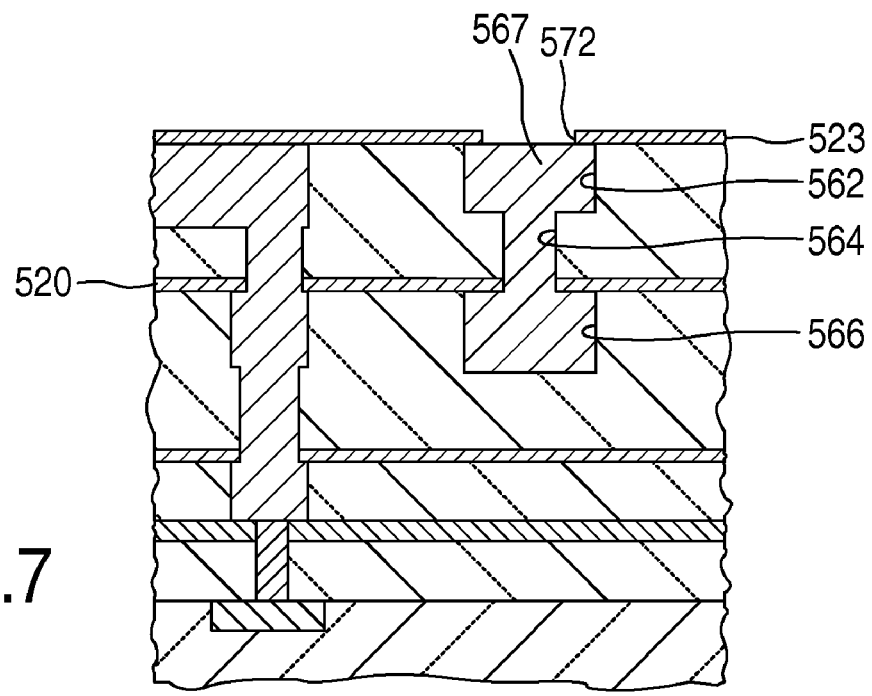
Figure 8:
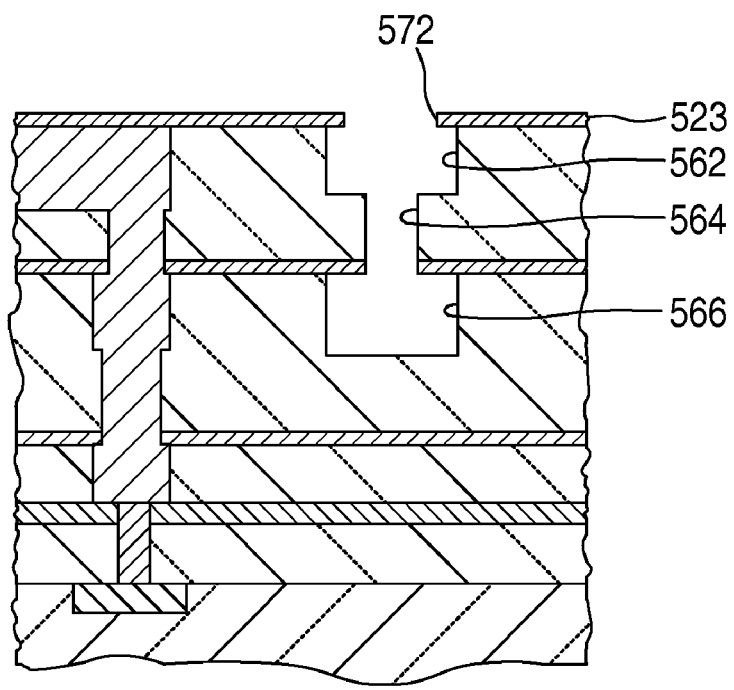

A fluidic-cooling channel 350 is prepared in the intermediate semiconductor product shown in FIG. 3. The arrangement of the fluidic-cooling channel 350 in the interconnect stack 306 becomes clear from a comparison between FIGS. 3 and 4. In FIG. 3, the fluidic-cooling channel is still filled with sacrificial metal, while FIG. 4 represents a later processing stage, in which the sacrificial metal filling has been selectively removed from the fluidic-cooling channel segments, which are therefore shown without any hatching in FIG. 4. The fluidic-cooling channel extends from the first interconnect level 310 through the third interconnect level 314. On the third interconnect level, a U-shaped channel structure is formed that connects two vertical channel sections 352 and 354 with each other. Other intralevel fluidic-cooling channel sections may be arranged on the first and second interconnect levels, but are not shown.

The fluidic-cooling path and the electrical interconnects can follow the same design rules. However, it is also obvious that the specific design of the fluidic-cooling path can be adjusted to make a cooling-fluid transfer from one metal level to the other easier. For instance, at via level, larger holes can be formed in comparison to electrical interconnects. It is also possible to employ a specifically adapted design such as short trenches. The width and shape of the trenches used for fluidic-cooling can also be specifically modified in comparison with the metal interconnect segments.

The fluidic-cooling channel 350 is thermally coupled to the semiconductor substrate 308 through W plugs 356 and 358.

The removal of the metal filling from the fluidic-cooling channel 350, which is performed between the processing stages shown in FIGS. 3 and 4, can in general be accomplished by two alternative methods. For the particular structure shown in FIGS. 3 and 4, a reverse electrolysis process is most suitable. However, the following description of FIGS. 5 through 8 will first turn to another alternative processing method, which involves a selective etching of the sacrificial metal filling.

Figs. 5 through 8 show different stages during fabrication of an integrated- circuit device of the invention. To illustrate this first method for forming an integrated-circuit device with a fluidic-cooling channel in the interconnect stack, only a section of an interconnect stack 506 on a substrate 508 is shown. The interconnect stack 506 has three interconnect levels 510, 512 and 514. Interlevel metallization barrier layers 516, 518, and 520 are arranged between (or respectively, on top of) intralevel dielectric layers 517, 519, and 521 and a dielectric layer 542. The lowest interlevel metallization barrier layer is typically made of silicon nitride, while the higher interlevel metallization barrier layers 518, 520, and 523 are typically made of TaN, Ta, TiN or a combination of these materials.

In previous processing steps, this interconnect stack 506 has been fabricated according to a known method, such as for example a dual damascene process. However, as a modification to that process the fabrication included not only the formation of an electrical interconnect structure 544 (as an illustrated example for any desired electrical interconnect structure), which connects an electrical contact 560 to a different contact (not shown). It also included the formation of sacrificial metal filling 567 in fluidic-cooling channel segments 562, 564, and 566, which are shown as illustrative examples of any desired fluidic-cooling channel structure that is to be formed in interconnect stack 506.

For a further processing of the interconnect structure in the formation of the fluidic-cooling channel, a mask layer 568 is deposited on top of metallization barrier layer 523. By known lithographic techniques, an opening 570 is formed at the lateral position of the desired fluidic-cooling channel section above cooling-channel segment 562. The opening 570 allows selective etch step that removes the metallization barrier layer 523 underneath the opening 570, to form an opening 572 (cf. FIG. 7) in metallization barrier layer 523. Subsequently, a selective etch step is performed, in which the metal filling, which preferably is a Cu filling is removed from channel segments 562, 564, and 566 (cf. FIG. 8). In this context, the etching is made easier by employing a punch-through process for barrier deposition. A punch-through process is a barrier deposition process well-known in the art, allowing barrier deposition on sidewalls of the openings without covering the bottom face. This is achieved by a resputtering step after the metallic-barrier deposition. The resputtering step eliminates the material at the bottom of high-aspect-ratio structures.

Figure 9:
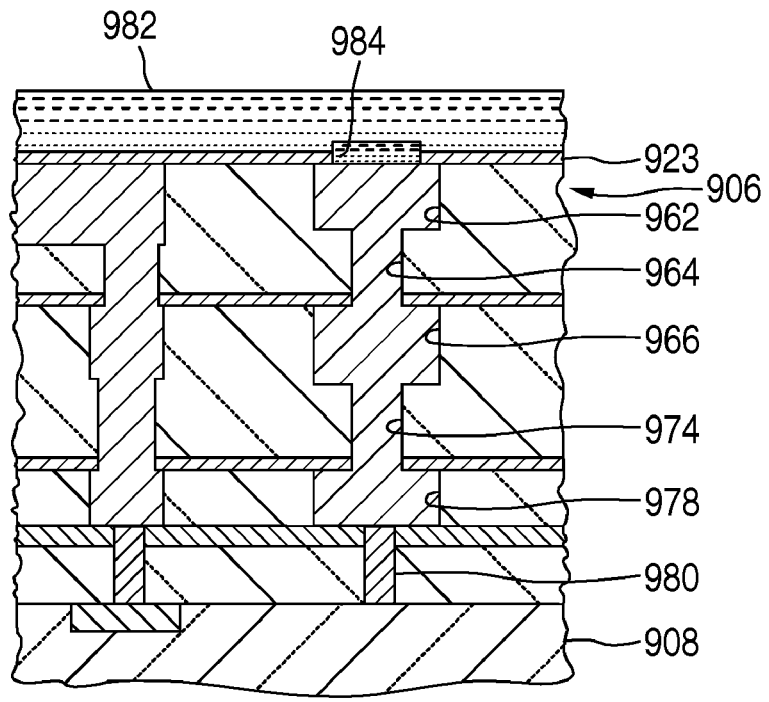
FIGS. 9 and 10 show two different stages during the fabrication of an integrated-circuit device of the invention according to a second embodiment of the method of the invention.
Figure 10:
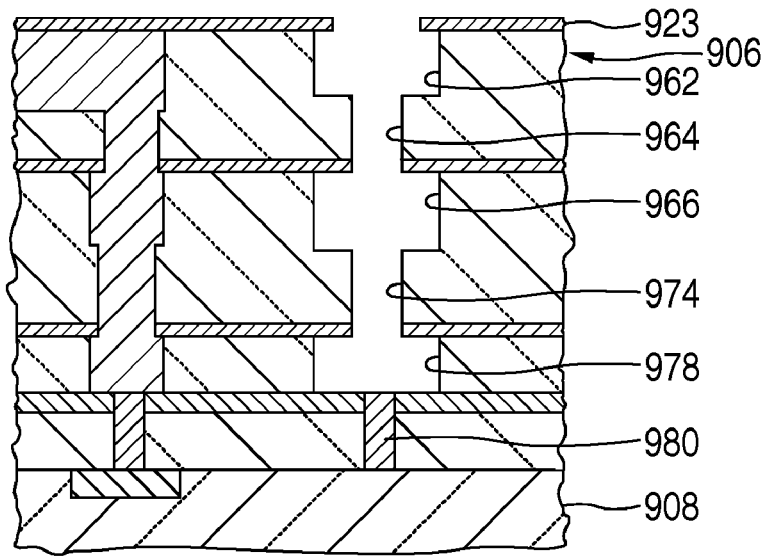

FIGS. 9 and 10 show two different stages during the fabrication of an integrated-circuit device of the invention according to a second embodiment of the method of the invention.

The exemplary interconnect structure 906, which is shown in FIGS. 9 and 10 in different processing stages, resembles that described with reference to FIGS. 5 through 8. One difference is that the fluidic-cooling channel comprises additional channel segments 974 and 978 in addition to channel segments 962 and 964. Channel segment 974 is a via segment that connects cooling-channel segments 978 and 966, which are arranged on different interconnect levels, with each other. Cooling channel segment 978 is thermally connected with the substrate by W plug 980.

On top of the metallization barrier layer 923, a wet-chemistry 982 is deposited. The wet-chemistry 982 is in contact with the sacrificial metal of the desired fluidic-cooling channel through an opening 984 of the dielectric liner. The wet-chemistry 982 allows the top surface polarization of the Cu cooling path and afterwards the reverse electrolysis of Cu. A bottom electrode is formed by the substrate 908.

By a reverse electrolysis process, which is well-known in the art, the sacrificial metal filling is removed from the mentioned cooling-channel segments. The resulting processing stage is depicted in FIG. 10.

The reverse electrolysis process that has been described with reference to FIGS. 9 and 10 is particularly suitable for forming fluidic-cooling channel segments that extend over more than one interconnect level. The process is obviously applicable in particular when no metallic barrier remains in the channel (punch through); however, this does not prevent that the process sequence can be tuned to also remove the metallic barrier because the used chemistry can be chosen to be not selective, or because the chemistry can successively be adapted to remove Cu, then metallic barrier material, then Cu, etc.

Figure 11:
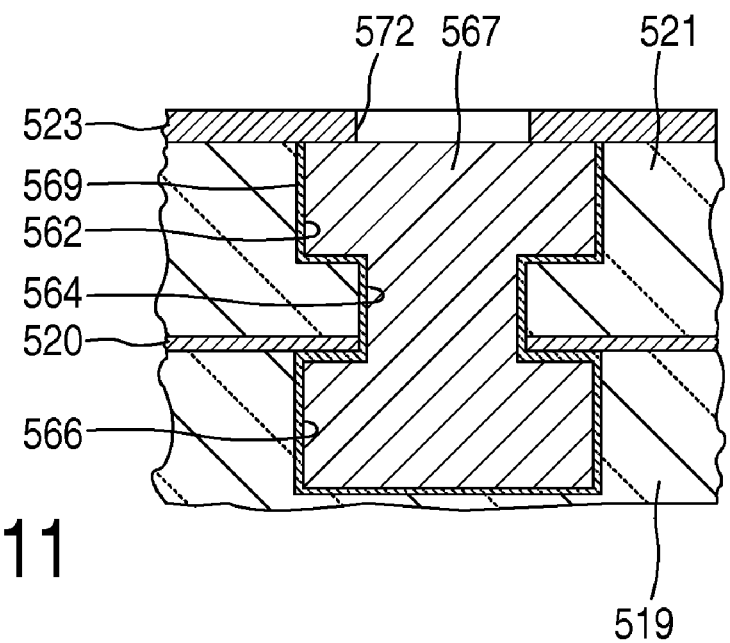
FIGS. 11 and 12 show two stages during the fabrication of a fluidic-cooling channel with a dielectric liner covering its sidewalls.
Figure 12:
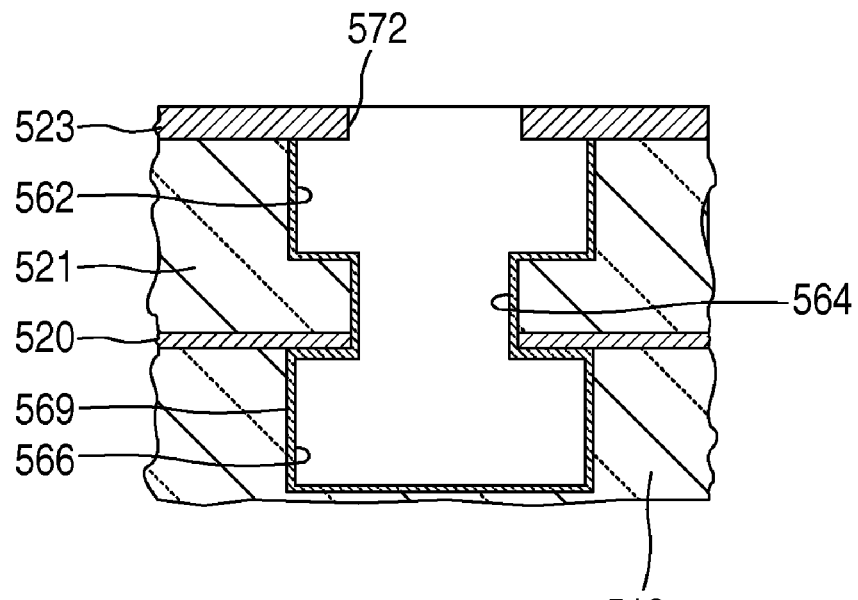

FIGS. 11 and 12 show two stages during the fabrication of a fluidic-cooling channel with a dielectric liner covering its sidewalls. The illustrative cooling-channel structure shown in FIGS. 11 and 12 corresponds to that discussed earlier in the context of FIGS. 5 to 8. Therefore, identical reference numerals are used in these figures for identical structural elements. In particular, the processing stage shown in FIG. 11 corresponds to that of FIG. 7. The following description will focus on differences to the structure of FIG. 7.

The sacrificial metal filling 567, which is still present in the fluidic-cooling channel segments 562, 564, and 566, is confined by a dielectric liner that was deposited prior to the step of filling respective fluidic-cooling sections. An additional mask step is required for depositing the dielectric liner 569 only in the fluidic-cooling channel segments, and not in the trench and via segments of the electrical interconnect structures. FIG. 12 shows that the dielectric liner 569 remains on the sidewalls during and after removal of the sacrificial metal filling 567. The advantage of this processing is that the intra-level dielectric layers 519 and 521 are protected during the removal of the sacrificial metal 567, and after filling of the fluidic-cooling channel with a cooling liquid. Chemical reactions between the cooling liquid and the material of the intra-level dielectric layers are avoided. The material of the dielectric liner should be chosen so as to enable a selective removal of the sacrificial metal 567.

In the following figures, sealing and interface solutions for the fluidic-cooling channel of the invention will be discussed with reference to FIGS. 13 through 16.

Figure 13:
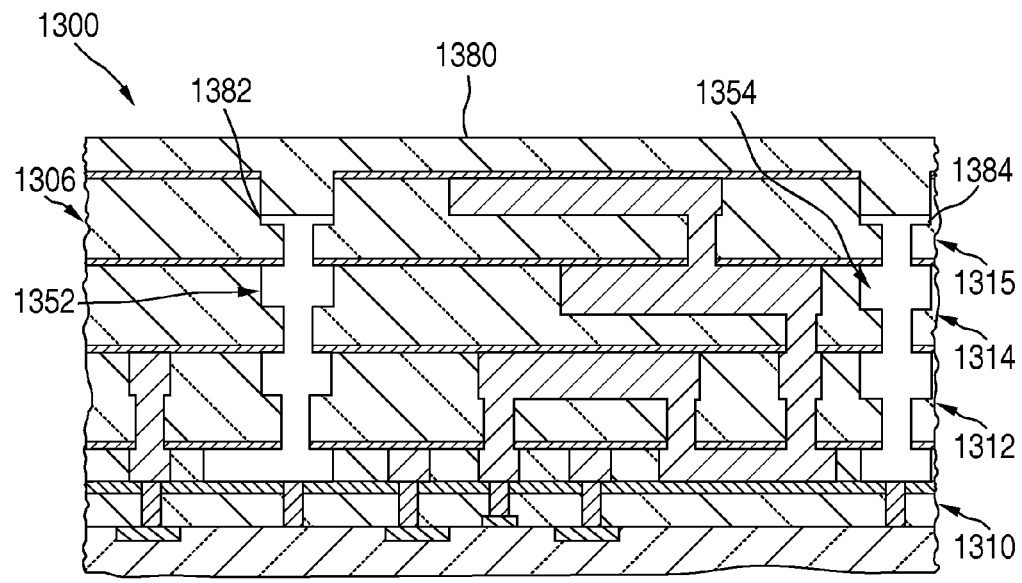
FIGS. 13 to 16 show alternative embodiments of integrated-circuit devices for connection to an external microfluidic cooling circulation system.

An integrated circuit device 1300 shown in FIG. 13 in a schematic view represents an illustrative example for explaining a concept of sealing the fluidic-cooling channel, which is conducted in the interconnect stack according to the invention. The general structure of integrated circuit element 1300 of FIG. 13 resembles that of integrated-circuit device 300 of FIG. 3. However, interconnect stack 1306 contains a fourth interconnect level 1315 in addition to interconnect levels 1310, 1312 and 1314. Two fluidic-cooling channel sections 1352 and 1354 have been formed during previous processing steps, in a way described with reference the previous figures.

The top-most interconnect level 1315 is sealed by a sealing layer 1380, which in the present embodiment is a dielectric layer. The dielectric sealing layer 1380 can for instance be deposited by plasma-enhanced chemical vapor deposition (PECVD), or by a spin-on technique. In the example of FIG. 13, a particularly simple process has been used that leads to a partial filling of the fluidic-cooling channel segments 1382 and 1384 with the material of the sealing layer. However, processing methods could be used that avoid such partial filling of the fluidic-cooling channel sections 1352 and 1354. The sealing layer prevents a drop-out of cooling liquid out of the interconnect stack 1306.

Figure 14:
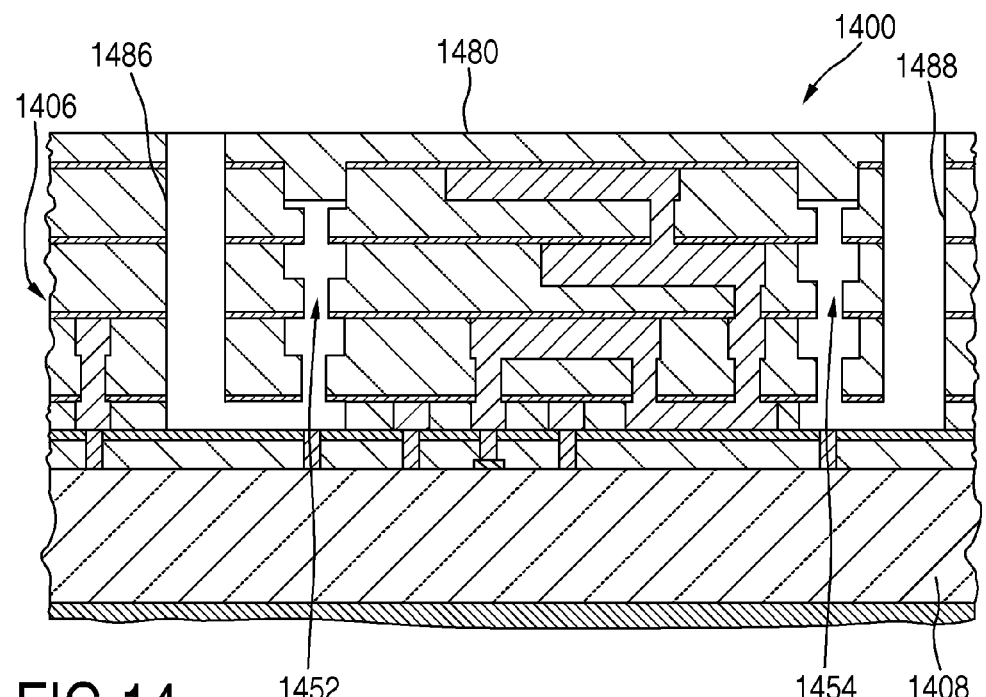

In the following, three examples of alternative fluidic interface solutions will be presented with reference to FIGS. 14 to 16. The integrated-circuit devices 1400, 1500, and 1600 of FIGS. 14, 15, and 16, respectively are based on the structure of integrated circuit device 1300 of FIG. 13. In addition, trunk channel sections 1486, 1488 (FIG. 14), 1586, 1588 (FIG. 15), and 1686, 1688 (FIG. 16) are provided in the integrated circuit devices 1400, 1500, and 1600, respectively. The trunk channel sections connect to respective branch channel sections 1452, 1454 (FIG. 14), 1552, 1554 (FIG. 15), and 1652, 1654 (FIG. 16). Again, the detailed arrangement of the branch and trunk channel sections should be chosen according to specific needs of a particular integrated-circuit device. The branch channel structures shown in the figures are of exemplary nature only.

The trunk channel sections are formed by a patterning step after the deposition of the respective sealing layer 1480, 1580, 1680. In the embodiment shown in FIG. 14, the trunk channel sections 1486 and 1488 are formed in the interconnect stack 1406 on a substrate 1408, by a masked etching, or by micro-drilling using a laser, plasma or mechanical drilling technique.

Figure 15:
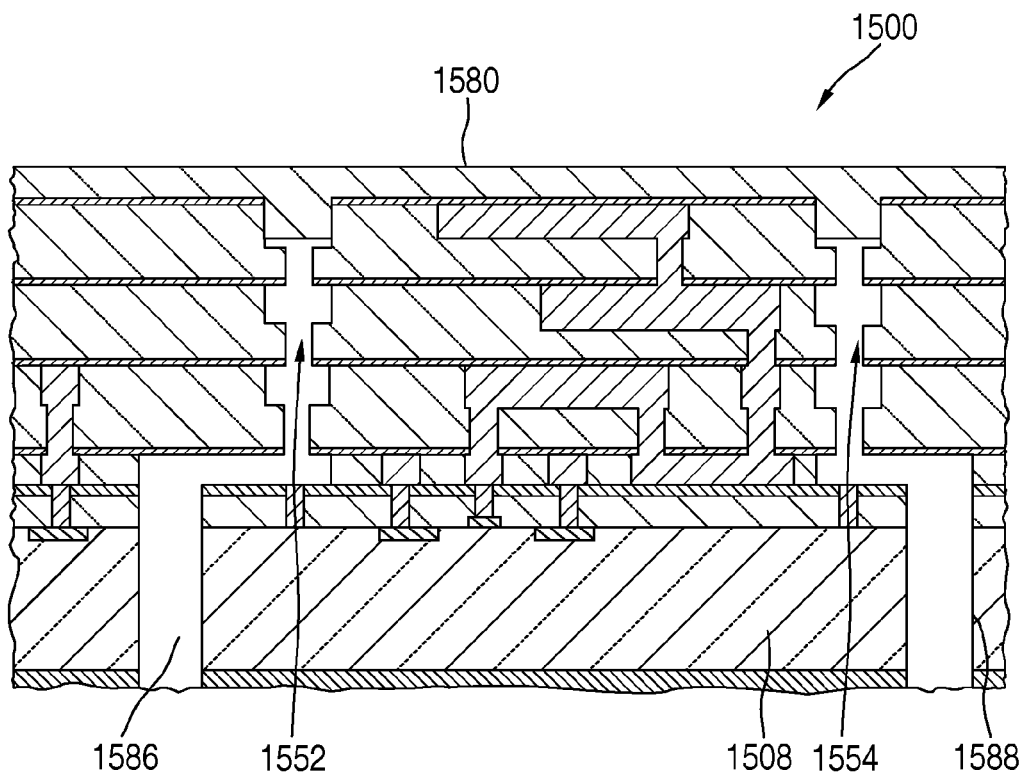
Figure 16:
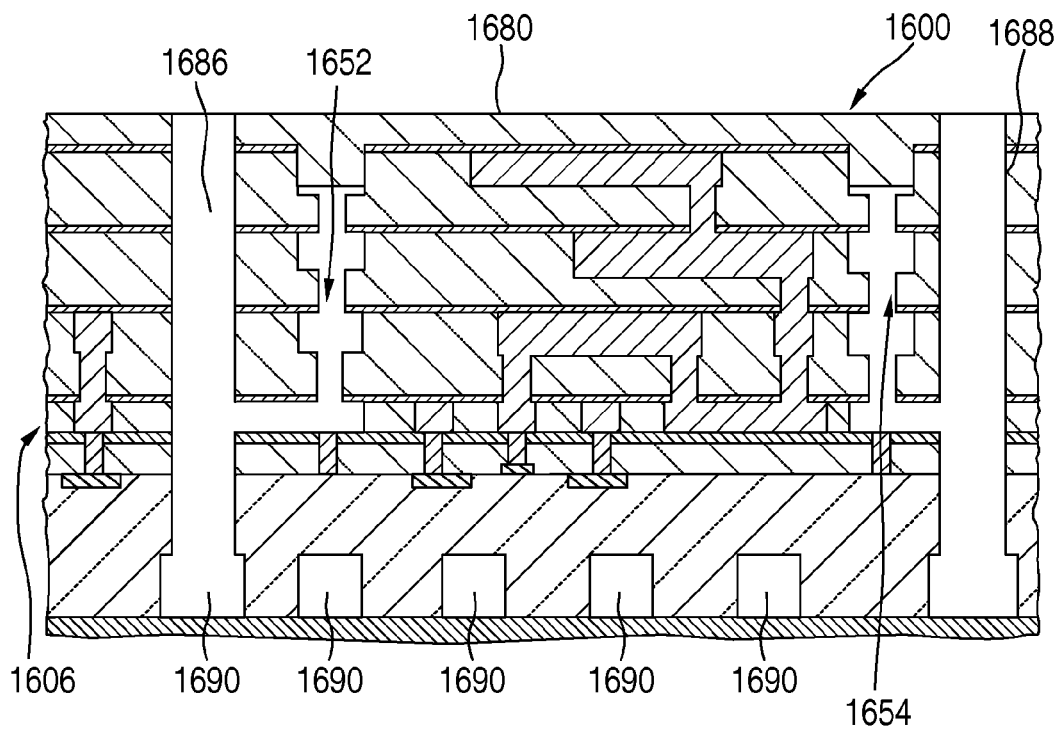

In the embodiment of FIG. 15, processing is performed from the backside of substrate 1508. The same processing methods as mentioned for the example of FIG. 14 can be used here as well.

In the embodiment of FIG. 16, the fluidic-cooling system comprises a substrate backside cooling by a substrate fluidic-cooling channel system 1690, which can for instance be formed by the technique of B. Dang et al., described in the introduction of the present application. The substrate fluidic-cooling system 1690 is connected to the fluidic-cooling channel system in the interconnect stack 1606 by the trunk channel sections 1686 and 1688. Fluidic interfaces are not shown for simplicity, but should be provided on the sealing layer 1680.

It is understood that the foregoing examples serve to illustrate the applicability of the invention for fabricating and operating integrated circuit devices with a fluidic-cooling system that provides heat dissipation from the interconnect stack into the substrate and to a heat sink arranged there, or to an external heat sink. The invention therefore effectively avoids operating failures of an integrated-circuit device due to a strong heat generation in the interconnect stack during operation of the integrated-circuit device. The invention is particularly useful for integrated-circuit devices that implement present-day and future ULSI technologies at the 90 nm technology node and below.

In the following claims, reference numbers shall not be construed as a limitation of the scope of the claims.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

Furthermore, the invention may also be embodied with less components than provided in the embodiments described here, wherein one component carries out multiple functions. Just as well may the invention be embodied using more elements than depicted in FIG. 1 or other Figures, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

The invention claimed is:

1. An integrated-circuit device with a fluidic-cooling channel comprising:
   a silicon substrate with an integrated circuit, the integrated circuit including a transistor structure that comprises contact elements, at least some of the contact elements of the transistor structure being located in the silicon substrate; and
   an interconnect stack formed on the silicon substrate, the interconnect stack having electrical interconnect segments on one or more interconnect levels and a dielectric layer sequence with a respective intralevel dielectric layer on a respective associated interconnect level of the one or more interconnect levels, electrically isolating different electrical interconnect segments on the associated interconnect level from each other,
   wherein the interconnect stack comprises the fluidic-cooling channel that extends to at least one of the one or more interconnect levels of the interconnect stack and through at least one interlevel metallization barrier layer in the interconnect stack, and
   wherein the fluidic-cooling channel extends between a fluidic-cooling input interface to receive a fluidic cooling medium from an external fluidic-cooling circulation driver and a fluidic-cooling output interface to transmit the fluidic cooling medium to the external fluidic-cooling circulation driver, both of the fluidic-cooling input interface and the fluidic-cooling output interface being provided on a substrate outer face of the silicon substrate or on a stack outer face of the interconnect stack, the substrate outer face of the silicon substrate and the stack outer face of the interconnect stack being on opposite sides of the integrated-circuit device.

2. The integrated-circuit device of claim 1, wherein sidewalls of the fluidic-cooling channel are covered with a dielectric liner, which is adapted to form a barrier for avoiding a contact between the fluidic cooling medium and a surrounding material of the intralevel dielectric layer or the at least one interlevel metallization barrier layer.

3. The integrated-circuit device of claim 1, further comprising a sealing layer which seals the highest interconnect level so as to prevent a discharge of a cooling fluid from the fluidic-cooling channel.

4. The integrated-circuit device of claim 1, wherein the fluidic-cooling channel extends into the silicon substrate.

5. The integrated-circuit device of claim 1, wherein the fluidic-cooling input interface and the fluidic-cooling output interface are provided on the substrate outer surface of the silicon substrate.

6. The integrated-circuit device of claim 1, wherein the fluidic-cooling channel comprises intralevel cooling-channel segments, which extend on a respective interconnect level of the one or more interconnect levels, and the intralevel cooling-channel segments are confined by a respective interlevel metallization barrier layer of the at least one interlevel metallization barrier layer on either a top side, which faces away from the silicon substrate, or on a bottom side, which faces towards the silicon substrate, and which are further confined by an interlayer dielectric layer of the intralevel dielectric layers.

7. The integrated-circuit device of claim 6, wherein the fluidic-cooling channel comprises a cooling-channel via segment, which forms a via hole in the respective interlevel metallization barrier layer and in an adjacent section of the intralevel dielectric layer, and wherein the cooling-channel via segment has a lateral extension that is smaller than that of the intralevel cooling-channel segments in one or both lateral directions.

8. The integrated-circuit device of claim 1, wherein the fluidic-cooling channel comprises an input trunk channel segment near the fluidic-cooling input interface and an output trunk channel segment near the fluidic-cooling output interface, and branch channels, which are connected between the input trunk channel segment and the output trunk channel segment.

9. The integrated circuit device of claim 1, wherein the at least one interlevel metallization barrier layer is arranged between two associated neighboring interconnect levels of the one or more interconnect levels, and which electrically isolates the different electrical interconnect segments on the associated neighboring interconnect levels from each other.

10. The integrated circuit device of claim 1, wherein the fluid cooling channel and the electrical interconnect segments have same design configurations as result of following the same design rules.

11. A method for fabricating an integrated-circuit device with an integrated fluidic-cooling channel, comprising:

providing a silicon substrate with an integrated circuit, the integrated circuit including a transistor structure that comprises contact elements, at least some of the contact elements of the transistor structure being located in the silicon substrate;

depositing a dielectric layer sequence on the silicon substrate comprising at least one intralevel dielectric layer to form an interconnect stack on the silicon substrate, an interlevel metallization barrier layer on the dielectric sequence;

forming a mesh of lines in the interconnect stack on the silicon substrate as to form electrical interconnect segments in the interconnect stack and a sacrificial filling in fluidic-cooling channel segments in the interconnect stack;

selectively removing the sacrificial filling from the fluidic-cooling channel segments in the interconnect stack on the silicon substrate, wherein the fluidic-cooling channel segments are formed to extend between a fluidic-cooling input interface to receive a fluidic cooling medium from an external fluidic-cooling circulation driver and a fluidic-cooling output interface to transmit the fluidic cooling medium to the external fluidic-cooling circulation driver, both of the fluidic-cooling input interface and the fluidic-cooling output interface being provided on a substrate outer face of the silicon substrate or on a stack outer face of the interconnect stack, the substrate outer face of the silicon substrate and the stack outer face of the interconnect stack being on opposite sides of the integrated-circuit device.

12. The method of claim 11, wherein the step of forming the mesh of lines comprises:

forming recesses in the dielectric layer sequence at desired lateral positions of the electrical interconnect segments and at desired lateral positions of the fluidic-cooling channel segments; and depositing a metal filling in the recesses of the dielectric layer sequence so as to form the electrical interconnect segments and the fluidic-cooling channel segments, wherein the metal filling in the fluidic-cooling channel segments is the sacrificial filling.

13. The method of claim 12, wherein the step of depositing the metal filling in the recesses of the dielectric layer sequence comprises removing the interlevel metallization barrier layer from a recess of the recesses before the deposition of the metal filling.

14. The method of claim 11, wherein the step of selectively removing the sacrificial filling comprises depositing a mask layer on an interlevel metallization barrier layer, forming an opening in the mask layer and in the interlevel metallization barrier layer at the at desired lateral positions of the fluidic-cooling channel, removing the mask layer, and selectively etching the sacrificial filling through the opening in the interlevel metallization barrier layer.

15. The method of claim 11, wherein the step of selectively removing the sacrificial filling comprises depositing a mask layer on an interlevel metallization barrier layer, forming an opening in the mask layer and in the interlevel metallization barrier layer at the at desired lateral positions of the fluidic-cooling channel, removing the mask layer, and performing a reverse electrolysis etching step of the sacrificial filling using a contact formed by the silicon substrate and an electrically conductive connection between the silicon substrate and the sacrificial filling in the recess for the fluidic-cooling channel.

16. The method of claim 11, further comprising a step of forming a thermally conductive plug on the silicon substrate at a desired lateral position for establishing a thermally conductive connection between the silicon substrate and a fluidic-cooling channel segment of the fluidic-cooling channel segments to be formed afterwards.

17. The method of claim 11, further comprising a step of sealing the fluidic-cooling channel segments of the highest interconnect level.

18. The method of claim 11, further comprising a step of forming a fluidic-cooling channel of the fluidic-cooling channel segments in the silicon substrate and a step of forming the fluidic-cooling input interface and the fluidic-cooling output interface to the fluidic-cooling channel in the interconnect stack.

19. The method of claim 11, wherein the fluidic-cooling input interface and the fluidic-cooling output interface are provided on the substrate outer surface of the silicon substrate.

* * * * *